United States Patent
Ohmi et al.

[11] Patent Number: 6,025,243
[45] Date of Patent: Feb. 15, 2000

[54] METHOD FOR PREPARING A SEMICONDUCTOR DEVICE

[75] Inventors: Kazuaki Ohmi, Hadano; Osamu Ikeda, Yokohama; Shigeyuki Matsumoto, Atsugi, all of Japan

[73] Assignee: Canon Kabushiki Kaisha, Tokyo, Japan

[21] Appl. No.: 08/257,294

[22] Filed: Jun. 9, 1994

Related U.S. Application Data

[62] Division of application No. 08/148,415, Nov. 8, 1993, abandoned, which is a continuation of application No. 07/975,139, Nov. 12, 1992, abandoned, which is a continuation of application No. 07/588,265, Sep. 26, 1990, abandoned.

[30] Foreign Application Priority Data

Sep. 26, 1989 [JP] Japan .................................. 1-250017
Sep. 26, 1989 [JP] Japan .................................. 1-250018

[51] Int. Cl.[7] .................................................. H01L 23/54
[52] U.S. Cl. .......................... 438/347; 438/352; 438/405; 147/DIG. 107

[58] Field of Search ..................................... 437/245, 187, 437/192; 148/DIG. 107; 438/347, 352, 405

[56] References Cited

U.S. PATENT DOCUMENTS 4,876,112  10/1989  Kaito et al. ............................ 427/38
5,218,232   6/1993  Yuzurihara et al. .................. 257/754

FOREIGN PATENT DOCUMENTS 86 06755  11/1986  European Pat. Off. .

*Primary Examiner*—Robert Kunemund
*Attorney, Agent, or Firm*—Fitzpatrick, Cella, Harper & Scinto

[57] ABSTRACT

A deposited film formation method comprises the steps of:
(a) feeding a gas of an organometallic compound containing molybdenum atom and hydrogen gas onto a substrate having an electron donative surface; and
(b) maintaining the temperature of the electron donative surface within the range of the decomposition temperature of the organometallic compound or lower and 800° C. or lower to form a molybdenum film on the electron donative surface.

1 Claim, 4 Drawing Sheets

METHOD FOR PREPARING A SEMICONDUCTOR DEVICE

This application is a division of application Ser. No. 08/148,415 filed on Nov. 8, 1993 now abandoned, which is a continuation application of Ser. No. 07/975,139, now abandoned, filed on Nov. 12, 1992, which is a continuation of application Ser. No. 07/588,265 filed Sep. 26, 1990, which is now abandoned.

BACKGROUND OF THE INVENTION

1. Field of the Invention

This invention relates to a method for forming deposited film and a method for forming a semiconductor device. Particularly, it pertains to a method for forming an Mo deposited film preferably applied to wiring of a semiconductor circuit device, or the like and a semiconductor device by use of the selective deposition Mo film.

2. Related Background Art

In the prior art, in electronic devices or integrated circuits by use of semiconductors, aluminum (Al) or Al-Si or the like have been primarily used for electrodes and wiring. Al is inexpensive and has a high electro-conductivity, and dense oxidized film can be formed on the surface. Accordingly, it has many advantages that the inner portion can be protected to be stabilized and adhesion to Si is good.

However, on the other hand, with higher integration, the self-align technique in which mask matching between the gate electrode and the diffusion layer, or the like is unnecessary is indispensable. Metal having low melting point such as Al cannot be used. In the MOS LSI of the prior art, as the gate electrode wiring capable of self-align, a polycrystalline Si doped with an impurity at high concentration has been widely employed. Whereas, with the progress of further higher integration, there ensues the problem that electrical resistance of fine polycrystalline Si wiring or the like becomes higher. This is vital to high speed actuation of the device. Accordingly, it has been required to have a high melting metal which is lower in volume resistivity than polycrystalline Si and yet is capable of self-align. Also, basically, even when Al can be employed, Si and the Al wiring react with each other during heat treatment at the contact electrode portion with the Si layer, whereby wire breaking or increased resistance of wiring are caused to occur. For this reason, a metal having higher melting point and lower electrical resistance has been employed as the electrode wiring material, and as the barrier metal which prevents the reaction between Si and Al at the contact portion. Particularly, Mo is attracting attention for its sufficiently high melting point (2620° C.) and low electrical resistance (4.9 $\mu\Omega$.cm).

Deposition methods according to the electron beam deposition and the sputtering method have been employed to Mo film used in Mo electrodes wiring or the like of the prior art. With finer dimensional formation by increased integration degree, the surface of LSI or the like is subject to excessive unevenness due to oxidation, diffusion, thin film deposition, and etching or the like. For example, electrodes or wiring metal must be deposited on the surface with a stepped difference, or deposited in a via-hole which is fine in diameter and deep. In 4 Mbit or 16 Mbit DRAM (dynamic RAM) or the like the aspect ratio (via hole depth/via hole diameter) of via-hole in which a wiring metal is to be deposited is 1.0 or more, and the via-hole diameter itself also becomes 1 $\mu$m or less. Therefore, even for a via-hole with large aspect ratio, the technique which can deposit a wiring metal is required.

Particularly, for performing sure connection to the device under insulating film such as $SiO_2$ or the like rather than film formation, a metal is required to be deposited so as to embed only the via-hole of the device. In such case, a method of depositing a wiring metal only on Si or metal surface and not depositing it on an insulating film such as $SiO_2$ is required.

It is difficult to achieve such a selective deposition and growth by the electronic beam deposition and sputter process used in the past. The sputter process is a physical deposition method performed by scattering the particles sputtered in vacuum. Therefore, the film thickness becomes very thin at the step portion and insulating film side wall, and the breaking of a wire may be caused in an extreme case. Further, unevenness of a film thickness and the breaking of a wire cause remarkable degradation of a reliability of LSI.

On the other hand, there has been developed the bias sputtering method in which a bias is applied on a substrate and deposition is performed so as to embed Al, Al alloy or Mo silicide only in the via-hole by utilizing the sputter etching action and the deposition action on the substrate surface. However, since the bias voltage of some 100 V or higher is applied on the substrate, deleterious influence occurs because of charged particle damaging such as change in threshold of MOS-FET or the like. Also, because of presence of both etching action and deposition action, there is the problem that the deposition speed cannot be essentially improved.

In order to solve the problems as described above, various types of CVD (Chemical Vapor Deposition) methods have been proposed. In these methods, chemical reaction of the starting gas in some form is utilized. In plasma CVD or optical CVD, decomposition of the starting gas occurs in gas phase, and the reaction species formed there further react on the substrate to give rise to film formation. In these CVD methods, surface coverage on unevenness on the substrate surface is good since the reaction occurs in a gaseous phase. However, carbon atoms contained in the starting gas molecule are incorporated into the film. Also, particularly in plasma CVD, the problem remained that there was damage by charged particles (so called plasma damage) as in the case of the sputtering method.

The thermal CVD method, in which the film grows through the surface reaction primarily on the substrate surface, is good in surface coverage on unevenness such as stepped portion of the surface. Also, it can be expected that deposition within via-hole will readily occur. Further, wire breaking at the stepped portion can be avoided.

For this reason, various studies have been made about the thermal CVD method as the method for forming Mo film. For example, there are hydrogen reduction method of $MoCl_5$ and Si reduction method of $MoF_6$ according to normal pressure CVD or reduced pressure CVD as introduced in Chapter 4 of Handotai Kenkyu (Semiconductor Research) Vol. 20 (Kogyo Chosakai, 1983). However, in the hydrogen reduction method of $MoCl_5$, a plurality of molybdenum halide such as $MoCl_3$ and others other than Mo may sometimes form at the portions other than the substrate surface heated within the film forming device. Therefore, it is difficult to control film formation. Also, although film formation may be possible, no selective deposition was observed.

On the other hand, for example, in EP 147913 (A3) Publication or U.S. Pat. No. 3,785,862, there is shown the method of forming Mo film by use of $MoF_6$ gas, hydrogen gas and an inert gas.

Whereas, in the Si reduction method of $MoF_6$, $MoF_6$ reacts in the presence of Si to precipitate Mo, whereby Si is etched. Therefore, there is a fear that the electronic circuit on Si wafer may be damaged. Also, $SiO_2$ is etched. However, for this reason, in the Si reduction method of $MoF_6$, deposition occurs primarily on Si substrate, and Mo film deposition dose not occur on $SiO_2$ at all, but it is clearly stated in U.S. Pat. No. 3,785,862 that Mo film is also deposited on $SiO_2$. This suggests that selective deposition of Mo is not so complete. In addition, as described above, both Si and $SiO_2$ are subjected to etching, and under such state there is a fear that problems may be involved practically concerning surface flatness and mixing of impurity, or the like As another method, there is an example of normal pressure CVD method of $Mo(CO)_6$ as described in Thin Solid Films, Vol. 63 (1979), p. 169. In this method, Mo film can be deposited on the substrate by use of normal pressure CVD with Ar as the carrier gas. However, in this method, a considerably large amount of oxygen and carbon in Mo film as impurities may be incorporated and for this reason, there is a fear that electrical resistance of the deposited film may be increased. Also, according to this method, selective deposition can be done with difficulty.

As described above, the deposition method of Mo film of the prior art had many problems to be improved, such that coverage of the stepped difference of the LSI surface was poor, that the Si surface of LSI was unnecessarily etched, that damage was given to $SiO_2$, that deposition reaction could be controlled with difficulty, or that a large amount of impurities were mixed into Mo film.

SUMMARY OF THE INVENTION

A first object of the present invention is to provide a deposition method of Mo film without giving damage to Si wafer or $SiO_2$.

A second object of the present invention is to provide a deposition method of Mo film with high stepped difference coverage of LSI surface.

A third object of the present invention is to provide a selective deposition method of Mo film effective for embedding of via-hole or the like.

A fourth object of the present invention is to provide a deposition method of Mo film in which Mo film can be deposited with good controllability.

A fifth object of the present invention is to provide a method for preparing a semiconductor device having characteristics such as excellent surface flatness, migration resistance or the like by use of the selective deposition method of Mo film for formation of wiring and electrode portions.

A sixth object of the present invention is to a deposited film formation method comprising the steps of:

(a) feeding a gas of an organometallic compound containing molybdenum atom and hydrogen gas onto a substrate having an electron donative surface, and (b) maintaining the temperature of said electron donative surface within the range of the decomposition temperature of said organometallic compound or higher and 800° C. or lower to form a molybdenum film on said electron donative surface.

A seventh object of the present invention is to a deposited film formation method comprising the steps of:

(a) feeding a gas of an organometallic compound containing molybdenum atom and hydrogen gas onto a substrate having an electron donative surface and a non-electron donative surface, and (b) maintaining the temperature of said electron donative surface within the range of the decomposition temperature of said organometallic compound or higher and 800° C. or lower to form a molybdenum film selectively on said electron donative surface.

An eighth object of the present invention is to a method for preparing a semiconductor device comprising the steps of:

forming a film comprising an insulating material on a semiconductor material, forming an opening on said film to have said semiconductor material exposed, and embedding an electroconductive material in said opening to form a part of electrical wiring, characterized in that the reaction is carried out between a gas of an organometallic compound containing molybdenum atom and hydrogen gas at a temperature of the decomposition temperature of said organometallic compound or higher and 800° C. or lower to deposit selectively molybdenum on said opening, thereby forming a part of said wiring.

DETAILED DESCRIPTION OF THE PREFERRED EMBODIMENTS

Figure 1:
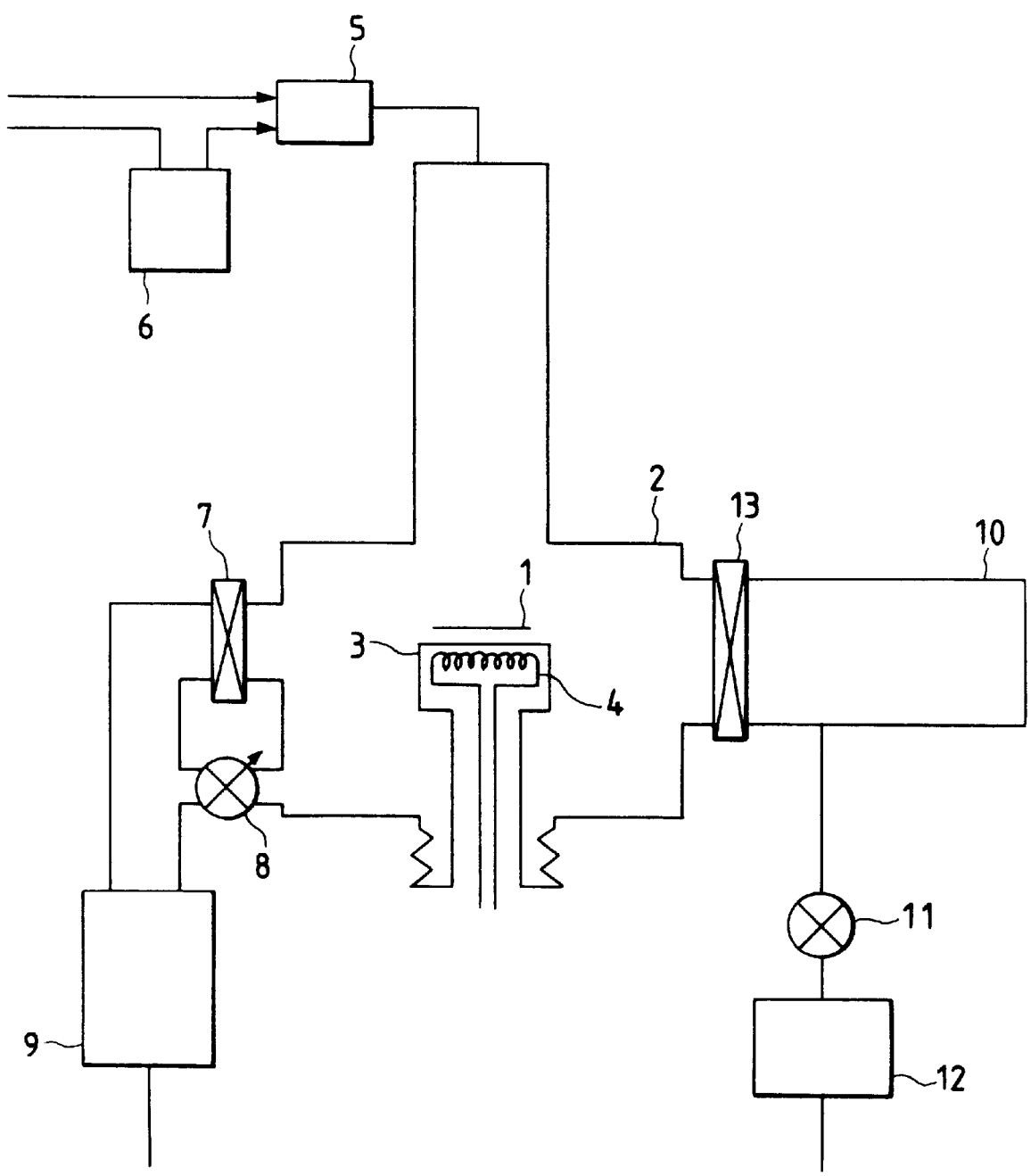
FIG. 1 shows a schematic view illustrating an example of a deposition film forming apparatus possible applicable to the present invention.

A preferable method for forming the deposited film of the present invention is as described below.

The method for forming the deposited film of the present invention is characterized in that a molybdenum film is formed on an electron donative surface through the reaction with a gas of an organometallic compound containing molybdenum atom and hydrogen gas.

On the other hand, a preferable method for forming the semiconductor device of the present invention is as described below.

The method for forming the semiconductor device of the present invention is characterized in that molybdenum deposits selectively through the reaction between a gas of an organometallic compound containing molybdenum atom and hydrogen gas on a semiconductor surface exposed from an insulating film, thereby forming a part of electrical wiring.

The Mo film obtained by the deposited film formation method according to the present invention contains little impurity such as carbon or the like, and also sufficiently low in electrical resistance. Also, the substrate is free from damage and good in controllability.

And, according to the formation method of deposited film of the present invention, a low resistance, dense Mo film can be selectively deposited on the substrate.

Also, by the preparation method of the semiconductor device of the present invention, an excellent semiconductor device by use of a low resistance, dense and flat Mo film at the wiring portion and the electrode portion can be provided.

In the present invention, as the starting gases for deposited film formation, an organic Mo compound and $H_2$ gases are employed. By subliming $Mo(CO)_6$, $Mo(CH_3)_6$, or the like as the organic Mo compound, which are solid at room temperature and reacting in a carrier gas such as $H_2$, Ar, or the like on a heated substrate, Mo film is deposited. The detailed mechanism of the reaction has not been necessarily clarified, but it may be considered that $Mo(CO)_6$ or the like reacts with $H_2$ gas on an electron donative substrate surface such as heated metal or semiconductor to form Mo. Since this reaction can proceed with difficulty at the place where the substrate surface is not electron donative, it may be considered that deposition of the film occurs with difficulty on a non-electron donative surface.

Here, electron donative characteristic is described below in detail.

The electron donative material refers to one having free electrons existing or free electrons intentionally formed in the substrate, for example, a material having a surface on which the chemical reaction is promoted through give-and-take of electrons with the starting gas molecules attached on the substrate surface. For example, generally metals and semiconductors correspond to such material. Those having very thin oxidized film on the metal or semiconductor surface are also included. For, with such thin film, the chemical reaction can occur between the substrate and the attached starting molecules.

Specifically, there may be included semiconductors such as single crystalline silicon, polycrystalline silicon, amorphous silicon, or the like, binary system or ternary system or quaternary system III–V compound semiconductors comprising combinations of Ga, In, Al as the group III element and P, As, N as the group V element, or II–VI compound semiconductors, or metals themselves such as tungsten, molybdenum, tantalum, aluminum, titanium, copper, or the like, or silicides of the above metals such as tungsten silicide, molybdenum silicide, tantalum silicide, aluminum silicide, titanium silicide, or the like, further metals containing either one of the constituent of the above metals such as aluminum silicon, aluminum titanium, aluminum copper, aluminum tantalum, aluminum silicon copper, aluminum silicon titanium, aluminum palladium, titanium nitride, or the like.

In contrast, the materials for forming the surface on which Mo is not deposited selectively, namely the electron non-donative material, are conventional insulating materials, oxidized silicon formed by thermal oxidation, CVD, or the like, glass or oxidized film such as BSG, PSG, BPSG, or the like, thermally nitrided film, silicon nitrided film by plasma CVD, low pressure CVD, ECR-CVD method, or the like.

Pyrolysis of the starting gas to be used in the present invention, for example, single substance of $Mo(CO)_6$ occurs at around 400° C., and also partial decomposition occurs at 300° C. If the pressure is high and there is no $H_2$, these decomposed products are deposited on the substrate without selectivity. Besides, at this time, a considerably large amount of carbon and oxygen is incorporated in the Mo film, whereby electrical resistance becomes higher. Accordingly, also for preventing mixing of impurities into the film, $H_2$ gas is indispensable during the reaction. At a substrate temperature of 300° C. or lower, when the pressure of the reaction gas is higher, deposition of the film also occur on a non-electron donative surface such as $SiO_2$, $Al_2O_3$, or the like, whereby selectivity of deposition is lowered. Hence, no selective deposition occurs unless the reaction pressure (partial pressure of organometallic compound) is 100 Torr or less, and practically it is desirably 10 Torr or less. If the temperature of the substrate is too high, $Mo(CO)_6$ and $H_2$ are pyrolyzed abundantly without the aid of an electron donative surface, whereby impurities in the film are again increased and also selectivity of deposition lost. And, no substrate temperature exceeding 800° C. can be employed, and the desirable substrate temperature is suitably 600° C. or lower. The most desirable temperature range is from 450 to 550° C. The method has been known in which $MoCl_5$, $MoF_6$ or the like is reduced with $H_2$ or Si, but in these methods, halogen elements may be mixed into the film, or there is damaging such as etching of Si substrate or $SiO_2$ film, which deteriorate characteristics of the substrate. For this reason, even the characteristics of the device by use of this may be sometimes lowered. On the other hand, according to the method of the present invention, since no halogen element is used at all, selective deposition of Mo film is possible without any problem at all as mentioned above. As the starting gas, other than $Mo(CO)_6$, $Mo(CH_3)_6$ may be employed. $Mo(CH_3)_6$ is more desirable than $Mo(CO)_6$ in obtaining a film of higher purity. However, organic compounds of Mo are not limited to these at all.

The preferred embodiments of the present invention are explained below as referring the drawings. FIG. 1 is a schematic view showing a deposition film forming apparatus for applying the present invention.

Here, 1 is a substrate for forming Mo film film. The substrate 1 is mounted on a substrate holder 3 provided internally of the reaction tube 2 for forming a space for formation of a deposited film which is substantially closed as shown in FIG. 1. As the material constituting the reaction tube 2, quartz is preferable, but it may be also made of a metal. Further, it is preferable to cool the reaction tube. The substrate holder 3 is made of a metal, and is provided with a heater 4 so that the substrate mounted thereon can be heated. And, the constitution is made so that the substrate temperature can be controlled by controlling the heat generation temperature of the heater 4.

The feeding system of gases is constituted as described below.

5 is a gas miser, in which the starting gas and the reaction gas are mixed, and the mixture is fed into the reaction tube 2. 6 is a starting gas gasifier provided for gasification of an organic metal as the starting gas.

The organic metal to be used in the present invention is solid at room temperature, and is formed into saturated vapor by sublimating the organic metal by passing a carrier gas through around the metal within the gasifier 6, which is in turn introduced into the mixer 5.

At this time, the sublimation is significantly accelerated by heating the gas or organic metal itself.

The evacuation system is constituted as described below.

7 is a gate valve, which is opened when performing evacuation of a large volume such as during evacuation internally of the reaction tube 2 before formation of the deposited film. 8 is a slow leak valve, which is used when performing evacuation of a small volume such as in controlling the pressure internally of the reaction tube 2 during formation of the deposited film. 9 is an evacuation unit, which is constituted of a pump for evacuation such as turbo molecular pump or the like.

The conveying system of the substrate 1 is constituted as described below.

10 is a substrate conveying chamber which can house the substrate before and after formation of the deposited film, which is evacuated by opening the valve 11. 12 is an evacuation unit for evacuating the conveying chamber, which is constituted of a pump for evacuation such as turbo molecular pump or the like.

The valve 13 is opened only when the substrate 1 is transferred between the reaction chamber and the conveying space.

As shown in FIG. 1, in the gas formation chamber 6 for forming the starting gas, for example, the gas formation chamber 6 is maintained at room temperature or the heated solid organic Mo compound is bubbled with $H_2$ or Ar (or other inert gas) as the carrier gas to form gaseous organic Mo compound, which is transported to the mixer 5. The $H_2$ gas as the reaction gas is transported through another route into the mixer 5. The gases are controlled in flow rates so that the respective partial pressures may become desired values.

$Mo(CO)_6$ or $Mo(CH_3)_6$ is preferred as the starting gas. Also $Mo(CO)_6$ and $Mo(CH_3)_6$ may be used in a mixture.

FIGS. 2A to 2E are schematic views showing the state of growing an Mo film in case that the present invention is employed to a selective formation of Mo film.

Figure 2A:
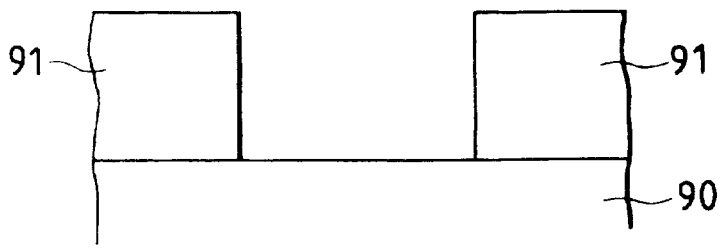
FIGS. 2a to 2d show a schematic sectional view illustrating a process for forming a deposition film according to the present invention.

FIG. 2A is an illustration showing schematically the cross-section of the substrate before formation of the Mo deposited film according to the present invention. 90 is the substrate comprising an electron donative material, and 91 a thin film comprising an electron non-donative material.

Figure 2B:
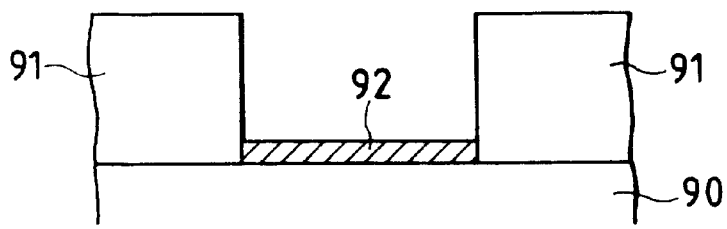

When $Mo(CO)_6$ as the starting gases and a gas mixture containing $H_2$ as the reaction gas are fed onto the substrate heated within a range from the decomposition temperature of $Mo(CO)_6$ or higher and 800° C. or less, Mo is precipitated on the substrate 90 other than the thin film 91 comprising the election non-donative material, whereby a continuous film of Mo is formed as shown in FIG. 2B. Here, the pressure within the reaction tube 2 should be desirably $10^{-3}$ to 760 Torr, and the $Mo(CO)_6$ partial pressure preferably $1.0×10^{-5}$ to $1.5×10^{-3}$-fold of the pressure within the above reaction tube.

Figure 2C:
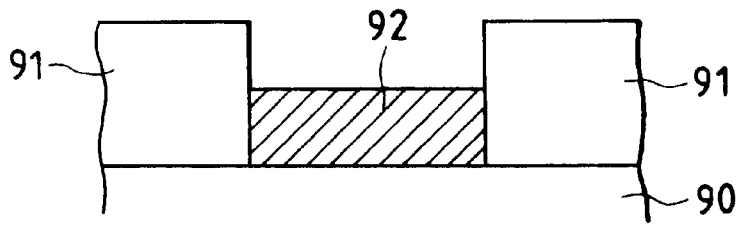
Figure 2D:
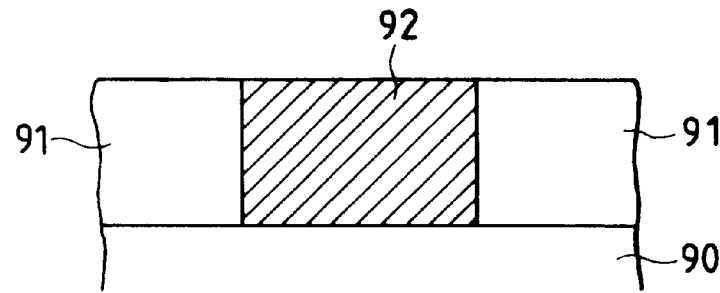

When deposition of Mo is continued under the above conditions, via the state of FIG. 2C, the Mo film grows to the level of the uppermost portion of the thin film 91 as shown in FIG. 2D.

As the result of analysis according to Auger's electron spectroscopy or photoelectric spectroscopy, no entrainment of an impurity such as carbon or oxygen is recognized in this film.

The deposited film thus formed has a resistivity of, for example, with a film thickness of 600 Å, 8–30 μohm.cm at room temperature which is far close to the bulk resistivity of Mo and lower than the resistivity of polycrystalline Si, and becomes continuous and flat film. The reflectance in the visible wavelength region is approximately 70–80%, and a thin film with excellent surface flatness can be deposited.

The substrate temperature in forming deposited film should be desirably the decomposition temperature of the starting gas containing Mo or higher, e.g. 350° C. or more and 800° C. or lower as mentioned above, but specifically a substrate temperature of 400 to 600° C. is desirable in case of $Mo(CO)_6$, and a substrate temperature of 350–550° C. is desirable in case of $Mo(CH_3)_6$.

A more preferable substrate temperature condition is 450° C. to 550° C. in case of $Mo(CO)_6$ and 400° C. to 500° C. in case of $Mo(CH_3)_6$. The Mo film deposited under the this condition contains no carbon and oxygen and is sufficiently low in the resistance.

In the apparatus shown in FIG. 1, Mo can be deposited on only one sheet of substrate in deposition for one time. Although a deposition speed of ca. 100 Å/min. can be obtained, it is still insufficient for performing deposition of a large number of sheets within a short time.

As the deposition film forming apparatus for improving this point, there is the low pressure CVD apparatus which can deposit Mo by simultaneous mounting of a large number of sheets of wafer. Since the Mo deposition according to the present invention utilizes the surface reaction of the heated electron donative substrate surface, for example, in the hot wall type low pressure CVD method wherein only the substrate is heated, an Mo compound can be desirably deposited with $Mo(CO)_6$ and $H_2$.

As the conditions of forming the deposited film, the reaction tube pressure may be $10^{-3}$ to 760 Torr, desirably 0.1 to 5 Torr, the substrate temperature 350° C. to 800° C., desirably 400° C. to 600° C., the $Mo(CO)_6$ partial pressure $1×10^{-5}$-fold to $1.5×10^{-3}$-fold of the pressure in the reaction tube. And under these conditions, Mo can be deposited on only the electron donative substrate.

Figure 3:
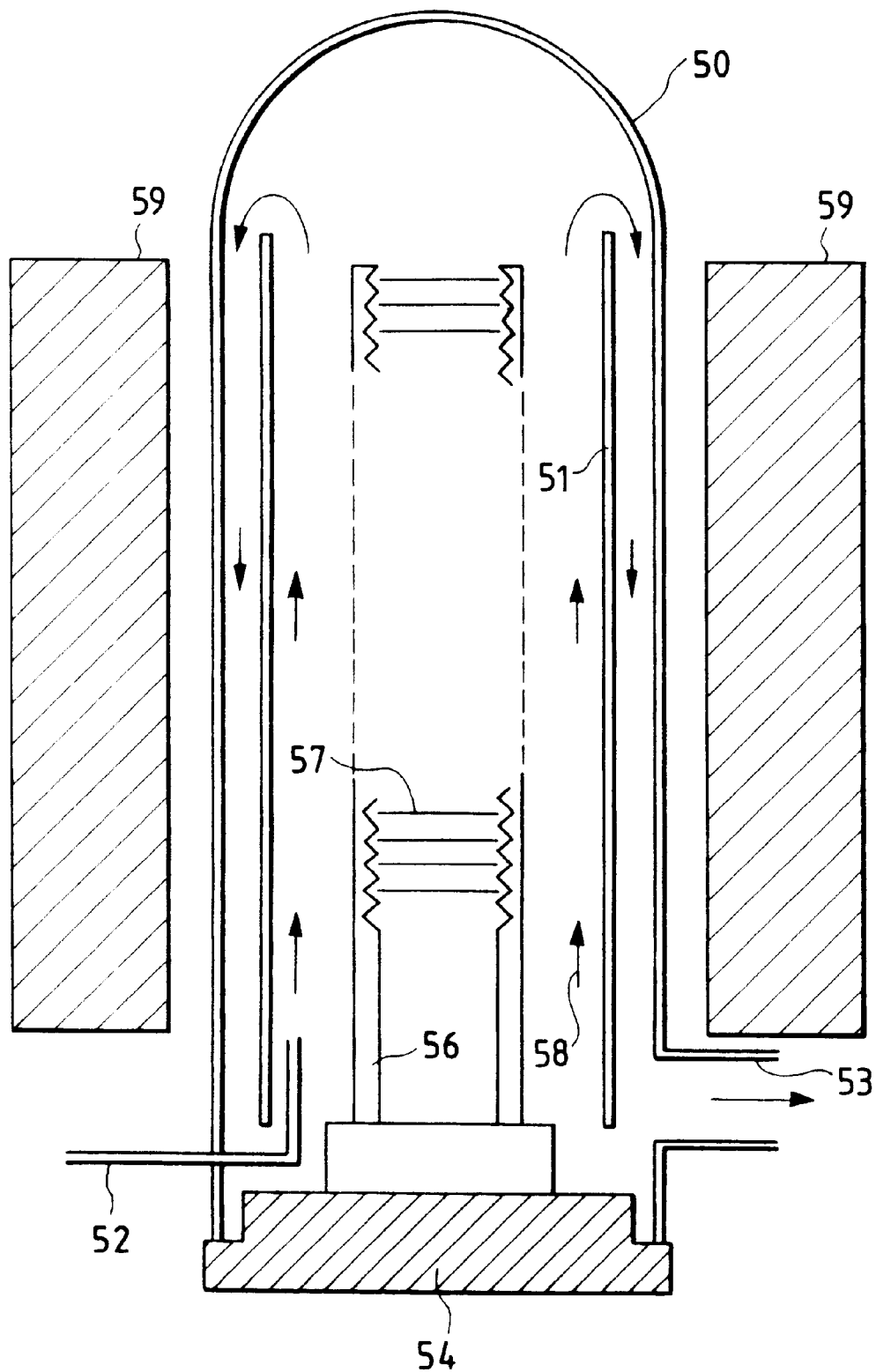
FIG. 3 shows a schematic view illustrating the other example of a deposition film forming apparatus possible applicable to the present invention.

FIG. 3 is a schematic view showing a deposited film formation apparatus to which such present invention is applicable.

57 is a substrate for forming an Mo film. 50 is an outside reaction tube made of quartz for forming a space for formation of deposited film which is substantially closed with respect to surrounding. 51 is an inside reaction tube made of quartz located for separation of the gas flow within the outside reaction tube 50, 54 a flange made of a metal for opening and closing the opening of the outside reaction tube 50, and the substrate 57 is located within the substrate holding member 56 provided internally of the inside reaction tube 51. The substrate holding member 56 should be desirably made of quartz.

Also, the present invention apparatus can control the substrate temperature by the heater portion 59. It is constituted so that the pressure internally of the reaction tube 50 is controllable by the evacuation system bound through the gas evacuation outlet 53.

The present apparatus has a first gas system, a second gas system and a mixer (all are not shown) similarly as in the apparatus shown in FIG. 1, and the starting gases are introduced into the reaction tube 50 through the starting gas introducing inlet 52. The starting gases react on the surface of the substrate 57 when passing through the inner portion of the inside reaction tube 51 as shown by the arrowhead 58 in FIG. 3 to deposit Mo on the substrate surface 57. The gases after the reaction pass through the gap portion formed by the inside reaction tube 51 and the outside reaction tube 50 and are discharged through the gas discharging outlet 53.

In taking in and out the substrate, the flange 54 made of a metal is ascended and descended by an elevator (not shown) together with the substrate holding member 56 and the substrate 57 to move to a predetermined position, thereby performing attachment and detachment of the substrate.

By forming a deposited film under the conditions as mentioned above by use of such apparatus, Mo film of good quality can be formed at the same time in all the wafers within the apparatus.

The present invention is explained below by giving Examples.

EXAMPLE 1

First, the procedure for Mo film formation is as follows. By use of the apparatus shown in FIG. 1, the reaction tube 2 is internally evacuated to ca. $1\times10^{-8}$ Torr by the evacuation unit 9. However, Mo film can be also formed if the vacuum degree within the reaction tube 2 may be worse than $1\times10^{-8}$ Torr. After cleaning of substrate such as Si wafer, the conveying chamber 10 was released to atmospheric pressure and Si wafer was mounted in the conveying chamber. The conveying chamber was evacuated to ca. $1\times10^{-6}$ Torr, and then the gate valve 13 was opened and the substrate was mounted on the wafer holder 3. Next, the gate valve 13 was closed, and the reaction chamber 2 was evacuated to a vacuum degree of ca. $1\times10^{-8}$ Torr.

In this Example, $Mo(CO)_6$ was sublimed to feed through the first gas line. $H_2$ was used to the carrier gas of $Mo(CO)_6$ line. The second gas line was used for $H_2$.

By passing $H_2$ through the second gas line, the pressure within the reaction tube 2 was made a predetermined value by controlling the opening of the slow leak valve 8. Then, the substrate was heated by current passage through the heater 4. After the substrate temperature has reached a predetermined temperature, $Mo(CO)_6$ was introduced into the reaction tube through the $Mo(CO)_6$ line. Here the total pressure was ca. 1.5 Torr within the reaction tube, and the $Mo(CO)_6$ partial pressure was made ca. $1.5\times10^{-4}$ Torr. Next, when $Mo(CO)_6$ was introduced into the reaction tube 2, Mo was deposited. After a predetermined deposition time has elapsed, feeding of $Mo(CO)_6$ was stopped. Next, heating of the heater 4 was stopped to cool the substrate. Feeding of $H_2$ gas was stopped, and after evacuation internally of the reaction tube, the substrate was transferred to the conveying chamber, and only the conveying chamber was made atmospheric before taking out the substrate. The outline of Mo film formation is as described above.

After preparing monocrystalline Si substrates as the samples, Mo films were deposited at the respective substrate temperatures according to the same procedure as described above under the following conditions:

Total pressure: 1.5 Torr $Mo(CO)_6$ partial pressure: $1.5\times10^{-4}$ Torr

The Mo films deposited by varying the substrate temperature were evaluated by use of various evaluation methods. The results are shown in Table 1.

As to the above examples, Mo of excellent quality was obtained within the temperature range of 400 to 600° C.

EXAMPLE 2

According to the following procedure, Mo film was formed. By the evacuation unit 9, the reaction tube 2 was evacuated internally to ca. $1\times10^{-8}$ Torr.

After cleaning of substrate such as Si wafer, the conveying chamber 10 is released to atmospheric pressure and the Si wafer was mounted in the conveying chamber. The conveying chamber was evacuated to ca. $1\times10^{-6}$ Torr, then the gate valve 13 was opened and the wafer was mounted on the wafer holder 3.

Next, the gate valve 13 was evacuated to a vacuum degree in the reaction chamber 2 of ca. $1\times10^{-8}$ Torr.

In this Example, the first gas line was used for $Mo(CO)_6$. As the carrier gas for the $Mo(CO)_6$ line, Ar different from Example 1 was employed. The second gas line was used for $H_2$.

By passing $H_2$ through the second gas line, the pressure within the reaction tube 2 was made a predetermined value by controlling the opening of the slow leak valve 8. A typical pressure in this Example was made approximately 1.5 Torr. Then, the wafer was heated by current passage through the heater 4. After the wafer temperature was reached a predetermined temperature, $Mo(CO)_6$ was introduced into the reaction tube through the $Mo(CO)_6$ line. The total pressure within the reaction tube was ca. 1.5 Torr, and the $Mo(CO)_6$ partial pressure is made ca. $1.5\times10^{-4}$ Torr. The Ar partial pressure was made 0.5 Torr. Next, when $Mo(CO)_6$ was introduced into the reaction tube 2, Mo was deposited. After a predetermined deposition time was elapsed, feeding of $Mo(CO)_6$ was stopped. Next, heating of the heater 4 was stopped to cool the wafer. Feeding of $H_2$ gas was stopped, and after evacuation internally of the reaction tube, the wafer was transferred to the conveying chamber, and only the conveying chamber was made atmospheric pressure before taking out the wafer. When Ar as the carrier gas was thus used, the resistivity and carbon content of Mo film formed were a little high. This is a level having no problems practically and the result almost similar to Example 1 was obtained.

EXAMPLE 3

By use of the low pressure CVD apparatus shown in FIG. 2, Mo film was formed on the substrate with the constitution as described below.

As the substrate surface material having electron donative properties, monocrystalline silicon (monocrystalline Si), polycrystalline silicon (polycrystalline Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (Ti-N), Copper (Cu), aluminum silicon copper (Al-Si-Cu), aluminum palladium (Al-Pd), titanium (Ti), molybdenum silicide (Mo-Si), tantalum silicide (Ta-Si) were employed. These samples, $Al_2O_3$ substrates and $SiO_2$ glass substrates were placed in the low pressure CVD apparatus shown in Table 3, and Mo films were formed within the same badge. The film forming conditions were a reaction tube pressure of 0.2 Torr, an $Mo(CO)_6$ partial pressure of $1.0\times10^{-5}$ Torr, a substrate temperature of 450° C.

As the result of film formation under such conditions, deposition of Mo film occurred only on samples having the electron donative substrate surface. The film quality of the Mo film was found to be very good, exhibiting the same properties as one prepared at a substrate temperature of 450° C. shown in Example 1. On the other hand, on both the $Al_2O_3$ substrate and the $SiO_2$ glass substrate which are electron non-donative, no Mo film was deposited at all.

EXAMPLE 4

Deposited films were formed according to the same procedure as shown in Example 1 by use of $Mo(CH_3)_6$ as the starting gas and setting the conditions as follows:

Total pressure: 2.0 Torr $Mo(CH_3)_6$ partial pressure: $2\times10^{-4}$ Torr,

As this result, in the temperature range of the substrate temperature from 350° C. to 550° C., Mo thin films containing very little carbon impurity and having low electrical resistance were deposited in a good selectivity on the substrate similarly as in Example 1.

EXAMPLE 5

The preparation of samples of this Example is described below.

Si substrates (N type, 1–2 ohm.cm) were subjected to thermal oxidation at a temperature of 1000° C. according to the hydrogen combustion system ($H_2$: 4 liters/M, $O_2$: 2 liters/M).

The film thickness was 7000 Å±500 Å, and the refractive index 1.46. A photoresist was coated on the whole Si substrate, and a desired pattern was baked by an exposure machine. The pattern was such that various holes of 0.25 µm×0.25 µm–100 µm×100 µm were opened. After development of the resist, with the photoresist as the mask, the subbing $SiO_2$ was etched by the reactive ion etching (RIE), or the like to have the substrate Si partially exposed. The samples having various sizes of $SiO_2$ holes of 0.25 µm×0.25 µm–100 µm×100 µm were prepared. The deposited film was formed on the samples thus formed similarly as in Example 1. Specifically the substrate temperature was changed and Mo film was deposited according to the procedure as described above under the following conditions:

Total pressure: 1.5 Torr, $Mo(CO)_6$ partial pressure: $1.5×10^{-4}$ Torr.

The Mo films deposited by varying the substrate temperature were evaluated by use of various evaluation methods. The results are shown in Table 2.

In the result of film formation, Mo was not deposited on $SiO_2$ at a temperature range from 400° C. to 600° C. at all, and Mo was deposited only on the portion with opening of $SiO_2$, i.e. the portion to have Si exposed.

EXAMPLE 6

By means of the reduced pressure CVD apparatus shown in FIG. 3, Mo films were formed on the substrates with the constitutions as described below (Samples 8-1 to 8-179).

Preparation of Sample 8-1

On a monocrystalline silicon as the electron donative first substrate surface material, a thermally oxidized $SiO_2$ film as the electron non-donative second substrate surface material was formed, and patterning was effected according to the photolithographic steps as shown in Example 5 to have the monocrystalline silicon surface partially exposed.

The film thickness of the thermally oxidized $SiO_2$ film was found to be 7000 Å, with the size of the exposed portion of the monocrystalline silicon, namely opening being 3 µm×3 µm. Thus, Sample 8-1 was prepared. (Hereinafter, such sample is expressed as "thermally oxidized $SiO_2$ (hereinafter abbreviated as T-$SiO_2$)/monocrystalline silicon").

Preparation of Samples 8-2 to 8-179

Sample 8-2 is an oxidized film formed by normal pressure CVD (hereinafter abbreviated as $SiO_2$)/monocrystalline silicon.

Sample 8-3 is a boron doped oxidized film formed by normal pressure CVD (hereinafter abbreviated as BSG)/ monocrystalline silicon.

Sample 8-4 is a phosphorus doped oxidized film formed by normal pressure CVD (hereinafter abbreviated as PSG)/ monocrystalline silicon.

Sample 8-5 is a phosphorus and boron doped oxidized film formed by normal pressure CVD (hereinafter abbreviated as BSPG)/monocrystalline silicon.

Sample 8-6 is a nitrided film formed by plasma CVD (hereinafter abbreviated as P-S:N)/monocrystalline silicon.

Sample 8-7 is a thermally nitrided film (hereinafter abbreviated as T-S:N)/monocrystalline silicon.

Sample 8-8 is a nitrided film formed by low pressure CVD (hereinafter abbreviated as LP-S:N)/monocrystalline silicon.

Sample 8-9 is a nitrided film formed by ECR apparatus (hereinafter abbreviated as ECR-SiN)/monocrystalline silicon.

Further, by combinations of the electron donative first substrate surface material and the electron non-donative second substrate surface material, Samples 8-11 to 8-179 shown in Table 3 were prepared. As the first substrate surface material, monocrystalline silicon (monocrystalline Si), polycrystalline silicon (polycrystalline Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (Ti-N), copper (Cu), aluminum silicon copper (Al-Si-Cu), aluminum palladium (Al-Pd), titanium (Ti), molybdenum silicide (Mo-Si), tantalum silicide (Ta-Si) were employed. These samples, $Al_2O_3$ substrates and $SiO_2$ glass substrates were placed in the low pressure CVD apparatus shown in Table 3, and Mo films were formed within the same badge. The film forming conditions were a reaction tube pressure of 0.2 Torr, an $Mo(CO)_6$ partial pressure of $1.0×10^{-5}$ Torr, a substrate temperature of 450° C.

As the result of film formation under such conditions, concerning all the samples applied with patterning from Sample 8-1 to 8-179, deposition of Mo film occurred only on the electron donative first substrate surface to embed completely the opening with the depth of 7000 Å. The film quality of the Mo film was found to be very good, exhibiting the same properties as one prepared at a substrate temperature of 450° C. shown in Example 5. On the other hand, on the second substrate surface which is electron non-donative, no Mo film was deposited at all, whereby complete selectivity was obtained. On both the $Al_2O_3$ substrate and the $SiO_2$ glass substrate which are electron non-donative, no Mo film was deposited at all.

EXAMPLE 7

By use of the low pressure CVD apparatus shown in FIG. 3, Mo film was formed on the substrate with the constitution as described below.

First, a thermally oxidized film as the electron non-donative second substrate surface material was used. A polycrystalline Si as the electron donative first substrate surface material was formed on the thermally oxidized film. Next, patterning was effected according to the photolithographic steps as shown in Example 5 to have the thermally oxidized film surface partially exposed. The film thickness of the polycrystalline silicon at this time was 2000 Å, with the size of the thermally oxidized film exposed portion, namely opening being 3 µm×3 µm. Such sample is called 9-1. By combinations of the electron non-donative second substrate surface materials (T-SiO2, CVD-SiO2, BSG, PSG, BPSG, P-SiN, T-SiN, LP-SiN, ECR-S:N) and the electron donative first substrate surface materials (polycrystalline Si, monocrystalline Si, Al, W, Mo, Ta, WSi, TiSi, TaSi, Al-Si, Al-Ti, TiN, Cu, Al-Si-Cu, Al-Pd, Ti, Mo-Si), Samples of 9-1 to 9-169 shown in Table 4 were prepared. These samples were placed in the low pressure CVD apparatus shown in FIG. 3, and Mo film was formed within the same batch. The film forming conditions were a reaction tube pressure of 0.2 Torr, an $Mo(CO)_6$ partial pressure of $1.0×10^{-5}$ Torr, a substrate temperature of 450° C. As the result of film formation under such conditions, in all the samples from 9-1 to 9-169, no Mo film was deposited at all at the opening having the electron non-donative second substrate exposed, but Mo of about 5000 Å was deposited only on the electron donative first substrate surface, whereby complete selectivity was obtained. The film quality of the Mo film deposited was found to be very good, exhibiting the same properties as one prepared at a substrate temperature of 450° C. in Example 5.

EXAMPLE 8

Deposition was carried out according to the same procedure as shown in Example 5 by use of $Mo(CH_3)_6$ as the starting gas under the following conditions:

Total pressure: 2.0 Torr $Mo(CH_3)_6$ partial pressure: $3 \times 10^{-4}$ Torr, in the temperature range of the substrate temperature from 350° C. to 550° C. As the result, Mo thin films containing very little carbon impurity and having low electrical resistance were deposited in a good electivity on the substrate similarly as in Example 5.

EXAMPLE 9

As an example for forming source and drain electrodes of a gate insulating type transistor, formation of an electrode in a contact hole on a source and a drain was carried out using the film forming process of the present invention. This is described with reference to FIG. 4.

Figure 4A:
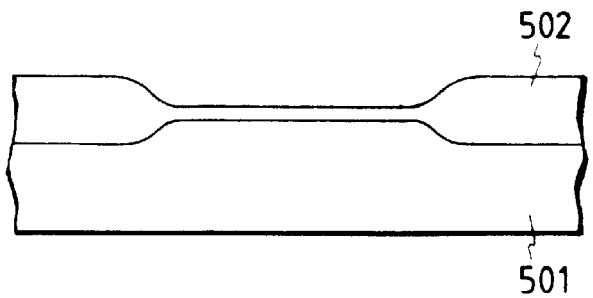
FIGS. 4a to 4E show a schematic view illustrating a method for producing a semiconductor device according to the present invention.
Figure 4B:
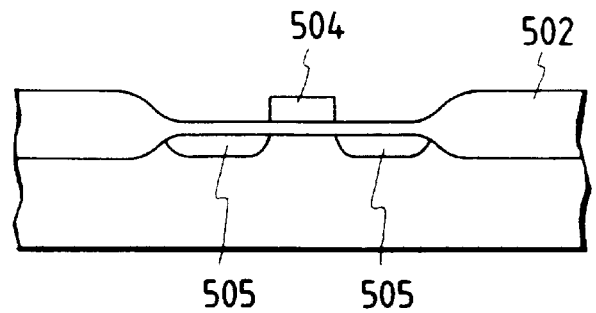
Figure 4C:
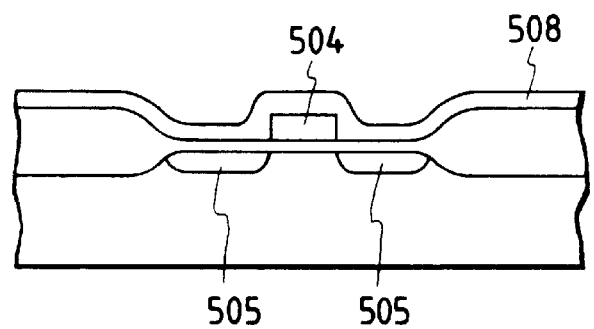
Figure 4D:
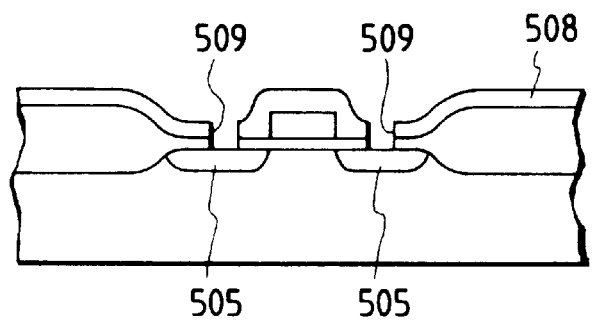

First, on a p-type silicon wafer 501, a thick field oxidized film and a thin thermal oxidized film 502 were formed by use of the usual selective oxidation process, etc. to the wafer 501 (FIG. 4A). Subsequently, using $SiH_4$ gas as a starting material gas, a polycrystalline silicon layer was formed by heat CVD method, and a polycrystalline silicon gate electrode 504 was formed by lithography method. At the same time, phosphorus was self-alignedly injected using the thick field oxidized film and the gate electrode 504 as a mask to form an impurity-diffused region 505 of $1 \times 10^{18}$ $cm^{-3}$ (FIG. 4B). Next, a silicon oxidized film 508 was formed by heat CVD method (FIG. 4C). A contact hole 509 with a size of 0.5 $\mu m \times 0.5$ $\mu m$ was formed by lithography method (FIG. 4D). The substrate thus obtained was moved to the apparatus as shown in FIG. 1 to form an Mo film.

Here, the substrate temperature was set to be 450° C. Using $Mo(CO)_6$ as a starting material gas and $H_2$ as a carrier gas, an Mo film was formed under conditions of an $Mn(CO)_6$ partial pressure of $1.5 \times 10^{-4}$ Torr and a total pressure of 1.5 Torr.

Figure 4E:
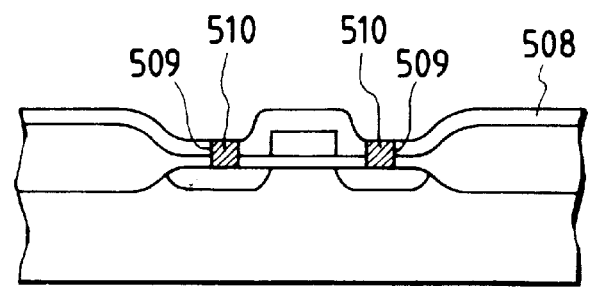

After the formation of the Mo film was completed, the transistor was taken out of the film forming apparatus and observed, to confirm that a Mo film 510 was deposited only on the phosphours-diffused Si 505 in the contact hole 509, and was not deposited on the oxidized film 508 (FIG. 4E). The surface of the Mo film 510 was very flat. Characteristics of the resulting transistor was examined to reveal that very good characteristics were exhibited.

It was also possible to form a thin Mo film only on the bottom of the contact hole 509 and thereafter form on the thin Mo film an Al film as an electrode material. It was still also possible to use the Mo film as a barrier metal.

TABLE 1

| Substrate temperature | 300° C. | 350° C. | 400° C. | 450° C. | 500° C. | 550° C. | 600° C. | 800° C. |
|---|---|---|---|---|---|---|---|---|
| Deposition on Si | Not deposited | Deposited in small amount | Deposited | Deposited | Deposited | Deposited | Deposited | Deposited |
| Carbon content | — | — | ~1% | Not detected | Not detected | Not detected | 1% or lower | ~1% |
| Resistivity | — | Non-measurement | ~150 $\mu\Omega cm$ | | | 8~30 $\mu\Omega cm$ | | |

TABLE 2

| Substrate temperature | 300° C. | 350° C. | 400° C. | 450° C. | 500° C. | 550° C. | 600° C. | 800° C. |
|---|---|---|---|---|---|---|---|---|
| Deposition on Si | Not deposited | Deposited in small amount | Deposited | Deposited | Deposited | Deposited | Deposited | Deposited |
| Carbon content | — | — | ~1% | Not detected | Not detected | Not detected | 1% or lower | ~1% |
| Resistivity | — | Non-measurement | ~150 $\mu\Omega cm$ | | | 8~30 $\mu\Omega cm$ | | |
| Deposition on oxide film | Not deposited | Not deposited | Not deposited | Not deposited | Not deposited | Not deposited | Deposited in small amount | Not deposited |

TABLE 3

| | Monocrystalline Si | Polycrystalline Si | W | Mo | Ta | WSi | TiSi | Al | AlSi |
|---|---|---|---|---|---|---|---|---|---|
| T-SiO$_2$ | 8-1 | 8-11 | 8-31 | 8-41 | 8-51 | 8-61 | 8-71 | 8-81 | 8-91 |
| SiO$_2$ | 8-2 | 8-12 | 8-32 | 8-42 | 8-52 | 8-62 | 8-72 | 8-82 | 8-92 |
| BSG | 8-3 | 8-13 | 8-33 | 8-43 | 8-53 | 8-63 | 8-73 | 8-83 | 8-93 |
| PSG | 8-4 | 8-14 | 8-34 | 8-44 | 8-54 | 8-64 | 8-74 | 8-84 | 8-94 |
| BPSG | 8-5 | 8-15 | 8-35 | 8-45 | 8-55 | 8-65 | 8-75 | 8-85 | 8-95 |

TABLE 3-continued

|        |       |       |       |       |       |       |       |       |       |
|--------|-------|-------|-------|-------|-------|-------|-------|-------|-------|
| P-SiN  | 8-6   | 8-16  | 8-36  | 8-46  | 8-56  | 8-66  | 8-76  | 8-86  | 8-96  |
| T-SiN  | 8-7   | 8-17  | 8-37  | 8-47  | 8-57  | 8-67  | 8-77  | 8-87  | 8-97  |
| LP-SiN | 8-8   | 8-18  | 8-38  | 8-48  | 8-58  | 8-68  | 8-78  | 6-88  | 8-98  |
| ECR-SiN| 8-9   | 8-19  | 8-39  | 8-49  | 8-59  | 8-69  | 8-79  | 8-89  | 8-99  |

|                    | AlTi   | Ti—N  | Cu    | Al—Si—Cu | AlPd  | Ti    | Mo—Si | Ta—Si |
|--------------------|--------|-------|-------|----------|-------|-------|-------|-------|
| T-SiO$_2$          | 8-101  | 8-111 | 8-121 | 8-131    | 8-141 | 8-151 | 8-161 | 8-171 |
| SiO$_2$            | 8-102  | 8-112 | 8-122 | 8-132    | 8-142 | 8-152 | 8-162 | 8-172 |
| BSG                | 8-103  | 8-113 | 8-123 | 8-133    | 8-143 | 8-153 | 8-163 | 8-173 |
| PSG                | 8-104  | 8-114 | 8-124 | 8-134    | 8-144 | 8-154 | 8-164 | 8-174 |
| BPSG               | 8-105  | 8-115 | 8-125 | 8-135    | 8-145 | 8-155 | 8-165 | 8-175 |
| P-SiN              | 8-106  | 8-116 | 8-126 | 8-136    | 8-146 | 8-156 | 8-166 | 8-176 |
| T-SiN              | 8-107  | 8-117 | 8-127 | 8-137    | 8-147 | 8-157 | 8-167 | 8-177 |
| LP-SiN             | 8-108  | 8-118 | 8-128 | 8-138    | 8-148 | 8-158 | 8-168 | 8-178 |
| ECR-SiN            | 8-109  | 8-119 | 8-129 | 8-139    | 8-149 | 8-159 | 8-169 | 8-179 |

Note: Numeral indicates Sample No.

TABLE 4

|            | Monocry-stalline Si | Polycry-stalline Si | W    | Mo   | Ta   | WSi  | TiSi | Al   | AlSi |
|------------|---------------------|---------------------|------|------|------|------|------|------|------|
| T-SiO$_2$  | 9-1                 | 9-11                | 9-31 | 9-41 | 9-51 | 9-61 | 9-71 | 9-81 | 9-91 |
| SiO$_2$    | 9-2                 | 9-12                | 9-32 | 9-42 | 9-52 | 9-62 | 9-72 | 9-82 | 9-92 |
| BSG        | 9-3                 | 9-13                | 9-33 | 9-43 | 9-53 | 9-63 | 9-73 | 9-83 | 9-93 |
| PSG        | 9-4                 | 9-14                | 9-34 | 9-44 | 9-54 | 9-64 | 9-74 | 9-84 | 9-94 |
| BPSG       | 9-5                 | 9-15                | 9-35 | 9-45 | 9-55 | 9-65 | 9-75 | 9-85 | 9-95 |
| P-SiN      | 9-6                 | 9-16                | 9-36 | 9-46 | 9-56 | 9-66 | 9-76 | 9-86 | 9-96 |
| T-SiN      | 9-7                 | 9-17                | 9-37 | 9-47 | 9-57 | 9-67 | 9-77 | 9-87 | 9-97 |
| LP-SiN     | 9-8                 | 9-18                | 9-38 | 9-48 | 9-58 | 9-68 | 9-78 | 6-88 | 9-98 |
| ECR-SiN    | 9-9                 | 9-19                | 9-39 | 9-49 | 9-59 | 9-69 | 9-79 | 9-89 | 9-99 |

|            | AlTi   | Ti—N  | Cu    | Al—Si—Cu | AlPd  | Ti    | Mo—Si | Ta—Si |
|------------|--------|-------|-------|----------|-------|-------|-------|-------|
| T-SiO$_2$  | 9-101  | 9-111 | 9-121 | 9-131    | 9-141 | 9-151 | 9-161 | 9-171 |
| SiO$_2$    | 9-102  | 9-112 | 9-122 | 9-132    | 9-142 | 9-152 | 9-162 | 9-172 |
| BSG        | 9-103  | 9-113 | 9-123 | 9-133    | 9-143 | 9-153 | 9-163 | 9-173 |
| PSG        | 9-104  | 9-114 | 9-124 | 9-134    | 9-144 | 9-154 | 9-164 | 9-174 |
| BPSG       | 9-105  | 9-115 | 9-125 | 9-135    | 9-145 | 9-155 | 9-165 | 9-175 |
| P-SiN      | 9-106  | 9-116 | 9-126 | 9-136    | 9-146 | 9-156 | 9-166 | 9-176 |
| T-SiN      | 9-107  | 9-117 | 9-127 | 9-137    | 9-147 | 9-157 | 9-167 | 9-177 |
| LP-SiN     | 9-108  | 9-118 | 9-128 | 9-138    | 9-148 | 9-158 | 9-168 | 9-178 |
| ECR-SiN    | 9-109  | 9-119 | 9-129 | 9-139    | 9-149 | 9-159 | 9-169 | 9-179 |

Note: Numeral indicates Sample No.

What is claimed is:

1. A method for preparing a semiconductor device comprising the steps of:

forming a film comprising an insulating material on a semiconductor substrate, forming an opening on said film to have a semiconductor substrate or a conductor surface exposed, embedding an electroconductive material in said opening to form a barrier metal, wherein a reaction is carried out between a gas of Mo(CH$_3$)$_6$ and hydrogen gas at a temperature of 350° C. to 550° C. to deposit molybdenum selectively in said opening, thereby forming said barrier metal, and forming an aluminum film on said barrier metal to form an electrical wiring.

* * * * *

UNITED STATES PATENT AND TRADEMARK OFFICE
CERTIFICATE OF CORRECTION

PATENT NO. : 6,025,243

DATED : February 15, 2000

INVENTOR(S) : KAZUAKI OHMI, ET AL.

It is certified that error appears in the above-identified patent and that said Letters Patent is hereby corrected as shown below:

ON THE TITLE PAGE [57] ABSTRACT:

Line 7, "lower" should read --higher--.

COLUMN 2:

Line 66, "Whereas, in" should read --In--.

COLUMN 3:

Line 5, "dose" should read --does--;
    Line 10, "like" should read --like.--;
    Line 49, "to" should read --to provide--; and
    Line 59, "to" should read --to provide--.

COLUMN 4:

Line 4, "to" should read --to provide--; and
    Line 57, "and" should read --and is--.

COLUMN 5:

Line 52, "single substance of" should read --for--; and
    Line 63, "occur" should read --occurs--.

COLUMN 6:

Line 24, "as referring" should read --with reference to--; and
    Line 41, "miser," should read --mixer,--.

UNITED STATES PATENT AND TRADEMARK OFFICE
CERTIFICATE OF CORRECTION

PATENT NO. : 6,025,243

DATED : February 15, 2000

INVENTOR(S) : KAZUAKI OHMI, ET AL.

It is certified that error appears in the above-identified patent and that said Letters Patent is hereby corrected as shown below:

COLUMN 7:

Line 48, "far" should be deleted; and
    Line 67, "in deposition for one time." should read --at a time.--

COLUMN 10:

Line 1, "was" should read --had--.

COLUMN 11:

Line 48, "con." should read --con).--.

COLUMN 12:

Line 48, "(T-SiO2, CVD-SiO2," should read --(T-$SiO_2$, CVD-$SiO_2$,--.

COLUMN 13:

Line 11, "electivity" should read --selectivity--.

UNITED STATES PATENT AND TRADEMARK OFFICE
CERTIFICATE OF CORRECTION

PATENT NO. : 6,025,243

DATED : February 15, 2000

INVENTOR(S) : KAZUAKI OHMI, ET AL.

It is certified that error appears in the above-identified patent and that said Letters Patent is hereby corrected as shown below:

COLUMN 14:

Line 18, "phosphours-diffused" should read
        --phosphorus-diffused--;
    Line 21, "was" should read --were--; and
    TABLE 2, "non-measurment" should read
        --Non-measurable--.

Signed and Sealed this

Twenty-seventh Day of March, 2001

Attest:

NICHOLAS P. GODICI

*Attesting Officer*  *Acting Director of the United States Patent and Trademark Office*